US006914472B2

(12) United States Patent
Rosnell

(10) Patent No.: US 6,914,472 B2
(45) Date of Patent: Jul. 5, 2005

(54) PHASE MODULATING SYSTEM

(75) Inventor: Seppo Rosnell, Salo (FI)

(73) Assignee: Nokia Corporation, Espoo (FI)

( * ) Notice: Subject to any disclaimer, the term of this patent is extended or adjusted under 35 U.S.C. 154(b) by 159 days.

(21) Appl. No.: 10/384,911

(22) Filed: Mar. 6, 2003

(65) Prior Publication Data

US 2004/0174222 A1 Sep. 9, 2004

(51) Int. Cl.$^7$ .............................................. H03K 17/00
(52) U.S. Cl. ....................... 327/407; 327/237; 327/276; 327/365
(58) Field of Search ............................... 327/161, 231, 327/237, 261, 276, 365, 407

(56) References Cited

U.S. PATENT DOCUMENTS 5,719,514 A * 2/1998 Sato ........................... 327/262
6,204,710 B1 * 3/2001 Goetting et al. ............ 327/276

* cited by examiner

*Primary Examiner*—David Mis

(57) ABSTRACT

Phase modulating systems and methods for modulating the phase of a signal are based on a digital control signal used to select one of a plurality of carriers having different phase angles. In order to reduce the number of short delays that have to be applied to the original signal for obtaining the plurality of carriers, it is proposed that delay elements are arranged in a matrix form. Alternatively, phase shifts are realized by digital frequency dividers instead of by delay elements. Further alternatively or in addition, part of the required delay is approximated or realized by an analog phase shifter. In case the phase modulating system is to be employed for modulating signals of different frequencies, the digital control signal is scaled with a factor associated to the respective frequency in order to change the addressing range for selecting a carrier from among the plurality of carriers.

14 Claims, 10 Drawing Sheets

PHASE MODULATING SYSTEM

FIELD OF THE INVENTION

The invention relates to the field of phase modulation. More specifically, the invention relates to phase modulating systems for modulating the phase of a signal based on a digital control signal. The invention relates equally to methods of modulating the phase of a signal based on a digital control signal.

BACKGROUND OF THE INVENTION

Phase modulating systems are known from the state of the art. In a phase modulating system, a signal generator providing the signal that is to be modulated is connected to a phase shifter. The signal generator can be an analog oscillator providing a sine wave or digital oscillator providing a square wave. The phase shifter applies a phase shift to a signal received from the signal generator and provides the phase modulated signal as output signal.

The phase shifter can be controlled by a control signal indicating the amount of the respectively desired phase shift. The control signal can be either analog or digital.

In a phase modulating system employing an analog control, an analog phase shifter is controlled by an analog control signal, for instance a control voltage. It is difficult, however, to implement a fully analog phase shifter that fulfills stringent precision requirements for modulation. In particular, the phase shift applied by an analog phase shifter will usually not follow its control voltage linearly.

In a phase modulating system employing a digital control, one of several available carriers having different phases is selected by a digital control signal. In order to provide several carriers with different phases, the phase shifter can be realized for example by a delay line dividing the generator signal into several carriers with the desired phases.

For illustration, a schematic block diagram of a phase modulating system controlled by an n-bit control signal is presented in FIG. 1. In this system, an oscillator 10 is connected via a delay line 11 and a multiplexer 12 to the output terminal 'Out' of the system. A single line connecting the delay line 11 and the multiplexer 12 represents a bus of $2^n$ parallel lines. Further, an input terminal 'In' is connected to a control input of the multiplexer 12. The oscillator 10 provides to the delay line 11 a radio frequency signal which is to be modulated. The delay line 11 delays the received signal and provides $2^n$ output signals to the multiplexer 12, each output signal being delayed by a different value. The multiplexer 12 constitutes a switching component which forwards the delayed signal corresponding to the value of an n-bit control signal received via the input terminal 'In' to the output terminal 'Out'.

A possible structure of the delay line 11 is shown in more detail in the block diagram of a phase modulating system presented in FIG. 2.

The system of FIG. 2 comprises again an oscillator 20. The output of the oscillator 20 is connected to the input of a first delay element 21, the output of the first delay element 21 is connected to the input of a second delay element 22, and the output of the second delay element 21 is connected to a third delay element 23. The delay elements 21, 22, 23 form a 2-bit delay line.

When the oscillator 20 provides a signal to the delay line, the signal passes through the delay elements 21, 22, 23 and is delayed by each of the delay elements 21, 22, 23 by the same amount. The output of the oscillator 20 constitutes a first selectable output Out0, the output of the first delay element 21 constitutes a second selectable output Out1, the output of the second delay element 22 constitutes a third selectable output Out2, and the output of the third delay element 23 constitutes a fourth selectable output Out3. One of these outputs Out0 to Out3 can be selected by a switching component (not shown) according to the value of a 2-bit control signal. To this end, each possible value of the 2-bit control signal is associated to another one of the outputs Out0 to Out3.

In general, the total delay applied by a delay line to a signal received by a signal generator should be sufficiently large to cover one period of the generator signal. On the other hand, the number of bits required in the modulating control signals determines the number of delay elements in the delay line. That is, if the number of bits is n, the number of delay elements should be $2^n-1$. In FIG. 2, the number of bits of the control signal is n=2, thus three delay elements 21, 22, 23 are needed.

If the frequency of the oscillator signal is for instance 2 GHz and the number of bits of the control signal is 8, the required delay is 500 ps/256=1.95 ps. This is a very short time even for a simple inverter and, hence, requires a very fast processing. Obviously, the situation gets even more critical when the number of bits of the control signal is 9 or 10. It is difficult to implement the large number of small delays which is required for high frequency generator signals and control signals having a high numbers of bits.

An additional problem relating to the required number of small delays results from the fact that the required delay for each delay element depends on the frequency of the signal provided by the signal generator. Thus, if the frequency changes, the delay values of the delay elements should also change, lest the signal deteriorates. If the signal quality at the nominal frequency is very good, it may be possible to tune the frequency over a narrow band and still preserve the signal quality within the required specifications, but a tuning over a large band is not possible with acceptable results.

The allowed tuning range could be increased by using several delay lines in parallel, each of which would have a different center frequency. The respective active delay line would then be the one of which the nominal frequency is closest to the desired carrier frequency. This approach has the disadvantage, however, that it requires even more small delay elements. Another way to solve the problem is to use tunable delay elements. The tuning range of the tunable delay elements might not be wide enough, though. Moreover, as the control of tunable delay elements is analog, it may suffer from non-linearity.

Some conventional modulators, such as an IQ (In-phase/Quadrature) modulator, could equally be used to accomplish a phase modulation. However, conventional modulators are more complex than systems which are based on phase shifters and may consume more power. They may also generate more noise than a phase shifter.

SUMMARY OF THE INVENTION

It is an object of the invention to provide a digitally controlled phase modulating system which supports a high modulation speed and at the same time a high resolution, i.e. a digital control signal with a high number of bits.

It is further an object of the invention to provide a simple phase modulating system which can be used for phase modulating signals of various frequencies.

It is in particular an object of the invention to reduce the number of very short delays in a digitally controlled phase modulating system.

In a first aspect of the invention, a phase modulating system for modulating the phase of a signal based on a digital control signal comprises a signal input for receiving the signal which is to be modulated. The proposed system further comprises connected to the signal input x delay elements connected to each other in series, where x is a first natural number with $x \geq 1$. Each of these x delay elements applies a delay of D to a respectively received signal. The proposed system further comprises connected to the signal input y delay elements connected to each other in series, where y is a second natural number with $y \geq 1$. Each of these y delay elements applies a delay of $D*(x+1)$ to a respectively received signal. The proposed system further comprises connected to an output of zero or more of the x delay elements at least one further delay element. In case more than one further delay element is connected to the output of any of the x delay elements, the respective further delay elements are connected to each other in series. Each of these further delay elements applies a delay of $D*(x+1)$ to a respectively received signal. Finally, the proposed system comprises a switching component selecting the signal at one of the signal input and at the output of one of the x, y and further delay elements in accordance with the digital control signal as phase modulated output signal.

The first aspect of the invention is based on the idea that the number of very small delays, i.e. of D, can be reduced in a phase modulating system by arranging delay elements in matrix form. In case of a control signal of n bits, delay elements applying the very small delay can be limited to n−1.

In order to ensure that delays increasing in equal steps are provided at the outputs, the number of further delay elements connected in series to the last one of the x delay elements connected in series is either y or y−1. The number of further delay elements connected in series to any other than the last one of the x delay elements, if any, is at the most y and at least equal to the number of further delay elements connected in series to the output of the respectively following one of the x delay elements connected in series. For example, in case there are on the one hand x=3 delay elements connected in series to the signal input and on the other hand y=3 delay elements connected in series to the signal input, also three further delay elements may be connected in series to the output of each of the x=3 delay elements. Alternatively, there may be only two delay elements connected in series to the output of the third one of the x delay elements, or only two delay elements connected in series to the output of the second and third one of the x delay elements, or only two delay elements connected in series to the output of all three of the x delay elements.

In a second aspect of the invention, a phase modulating system for modulating the phase of a signal based on a digital control signal comprises a first frequency division stage receiving the signal which is to be modulated. This first frequency division stage accomplishes a phase shift between its at least two outputs. The proposed system further comprises at least one further frequency division stage with digital frequency dividers accomplishing a phase shift between their respective at least two outputs. The number of digital frequency dividers of each frequency division stage corresponds to the total number of outputs of the respective preceding frequency division stage, and each one of said further digital frequency dividers of a respective further frequency division stage is connected to another one of the outputs of the respective preceding frequency division stage. It is understood that the outputs of a respective further frequency division stage correspond to the outputs of the digital frequency dividers comprised in this stage. The proposed system finally comprises a switching component, wherein phase shifted signals resulting in the last one of the frequency division stages are fed to this switching component on the one hand directly and on the other hand after an inversion. The switching component selects one of the received signals in accordance with the digital control signal as a phase modulated output signal.

The second aspect of the invention is based on the idea that the number of very small delays can be reduced by making use of a plurality of frequency division stages, e.g. in form of cascaded digital frequency dividers, instead of delay elements for forming a delay line.

The first frequency division stage may comprise in particular either a digital frequency divider or at least two analog phase shifters. It is to be noted that there may be additional frequency division stages between the first frequency division stage and the further frequency division stages, each accomplishing additional phase shifts between their outputs using analog phase shifters.

In a third aspect of the invention, a phase modulating system for modulating the phase of a signal based on a digital n-bit control signal comprises a delay arrangement receiving a signal which is to be modulated and delaying this signal to obtain $2^k$ signals of different phase angles, where k corresponds to a number of most significant bits of the n-bit control signal. The proposed system further comprises an approximation arrangement generating a further digital control signal out of the digital n-bit control signal. The further digital control signal alternates between the value of the first k most significant bits of the digital n-bit control signal and the value of the first k most significant bits incremented by one, and the value of the further digital control signal corresponding on an average to the value of the digital n-bit control signal. Finally, the proposed system comprises a switching component selecting alternately two of the $2^k$ signals obtained in the delay arrangement in accordance with the further digital control signal as a phase modulated output signal.

The third aspect of the invention is based on the idea that only the most significant bits of a digital control signal have to be used for controlling a delay line, while the remaining least significant bits can be used to approximate the rest of the original full-length delay line.

In a fourth aspect of the invention, a phase modulating system for modulating the phase of a signal based on a digital n-bit control signal comprises a delay arrangement receiving the signal which is to be modulated and delaying the signal to obtain $2^k$ signals of different phase angles. The value of k corresponds to a number of most significant bits of the n-bit control signal. The proposed system further comprises a switching component selecting and forwarding one of $2^k$ signals provided by the delay arrangement in accordance with the k most significant bits of the digital n-bit control signal. The proposed system further comprises a digital-to-analog converter converting the n−k least significant bits of the digital n-bit control signal into an analog control signal. Finally, the proposed system comprises an analogously controlled component receiving a selected signal from the switching component. The analogously controlled component shifts the received signal in phase in accordance with an analog control signal provided by the digital-to-analog converter and provides the shifted signal as phase modulated output signal. The analogously controlled component can be in particular an analog phase shifter or a tunable delay element.

It is understood that the order of the delay arrangement followed by the switching component and the analog phase shifter can also be reversed, such that the signal which is to be phase modulated is first shifted in phase by the analog phase shifter and then delayed by the delay arrangement.

The fourth aspect of the invention is based on the idea that the entire phase shift can be achieved by combining a digital phase shifter with an analog phase shifter. It is therefore proposed that the most significant bits of a digital control signal are provided to a digital phase shifter, while the remaining least significant bits are provided via a digital-to-analog-converter to an analog phase shifter. One of the two phase shifters applies a first phase shift to a signal that is to be modulated according to the received control signal, and the second one of the two phase shifters applies an additional phase shift according to the received control signal.

In a fifth aspect of the invention, a phase modulating system is provided for modulating the phase of signals of different frequencies down to a minimum frequency based on a respective digital control signal. This phase modulating system comprises a delay arrangement receiving a signal which is to be modulated and delaying this signal for obtaining a plurality of signals which are delayed in equal steps. The number of this plurality of signals is selected such that the maximum delay is at least basically equal to one period of a signal of the minimum frequency minus the size of the equal steps of delays. The proposed system further comprises a scaling unit receiving a digital control signal for a signal which is to be modulated and scaling this digital control signal depending on the frequency of the signal which is to be modulated for obtaining a scaled digital control signal. The scaling factor is the smaller the higher the frequency of the signal which is to be modulated. Finally, the proposed system comprises a switching component connected to the delay arrangement. The switching component receives a plurality of signals from the delay arrangement and selects one of the signals out of this plurality of signals according to a scaled digital control signal provided by the scaling unit as phase modulated output signal.

The fifth aspect of the invention is based on the idea that a single delay arrangement can be used for several frequencies of a signal that is to be modulated, if the respective digital control signal is divided or multiplied by a factor which is correlated to the frequency. When dividing the control signal by an entire factor i, this results in that only the first $1/i^{th}$ part of the output signals of the delay arrangement can be addressed for selection. When multiplying the control signal by an entire factor i, this results in that only every $i^{th}$ one of the output signals of the delay arrangement can be addressed for selection.

If the scaling factor can be close to, but not equal to 1, then the chosen delay for the associated frequency corresponds only on the average to the correct value, and the modulated signal will be more deteriorated than in the basic case using a factor of 1.

It is an advantage of all of the presented aspects of the invention that they allow a significant reduction or even a complete avoidance of delay elements applying a very small delay to received signals. Thereby, they all support a high modulation speed and at the same time a high resolution.

Each of the phase modulating systems of the first to fifth aspect of the invention may be anything from a circuit comprising basically only the respectively mentioned components to any larger entity including the respectively mentioned components.

Implementations of the phase modulating systems of the five aspects of the invention can rely on analog as well as on digital components, unless the employment of an analog or a digital component is specifically indicated.

In each of the presented five aspects of the invention, the frequency of the signal which is to be modulated is equal to the desired frequency, e.g. to a desired RF frequency, or has a predetermined relation to this frequency, unlike in the case of digital modulators, in which a fixed frequency clock can be used.

Each of the first to fifth aspect of the invention can also be realized by a corresponding method.

Preferred embodiments of the invention become apparent from the dependent claims.

Other objects and features of the present invention will become apparent from the following detailed description considered in conjunction with the accompanying drawings. It is to be understood, however, that the drawings are designed solely for purposes of illustration and not as a definition of the limits of the invention, for which reference should be made to the appended claims. It should be further understood that the drawings are not necessarily drawn to scale and that, unless otherwise indicated, they are merely intended to conceptually illustrate the structures and procedures described herein.

DETAILED DESCRIPTION OF THE INVENTION

Figure 1:
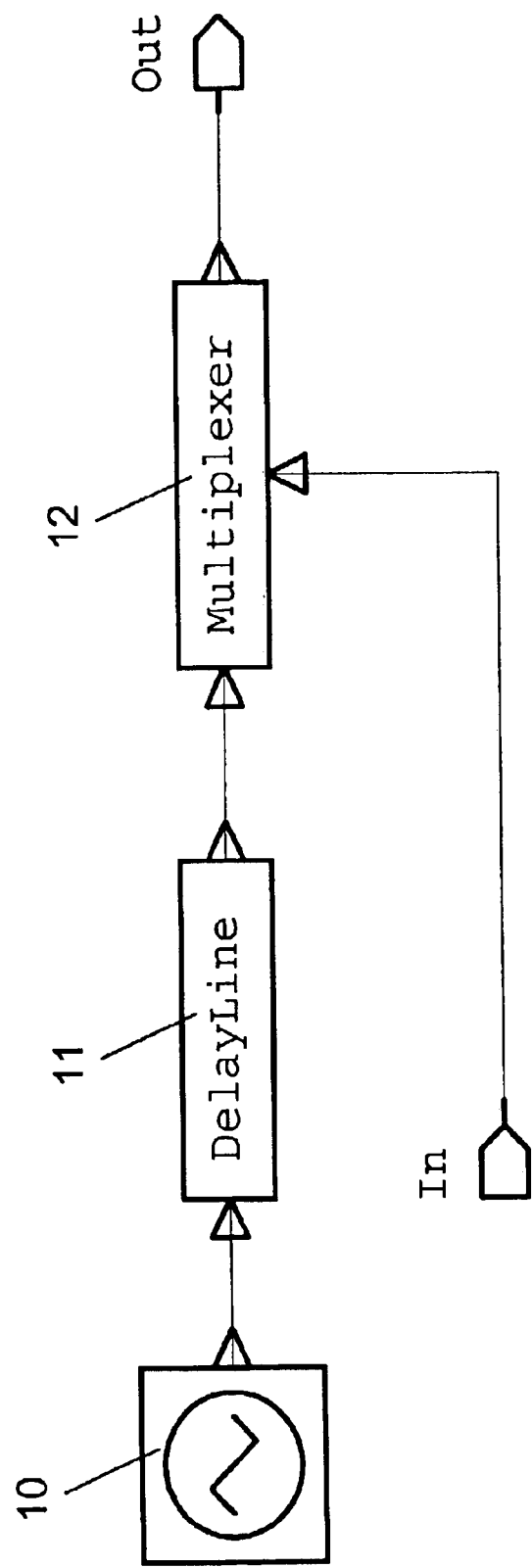
FIG. 1 is a first schematic block diagram of a known digitally controlled phase modulating system.
Figure 2:
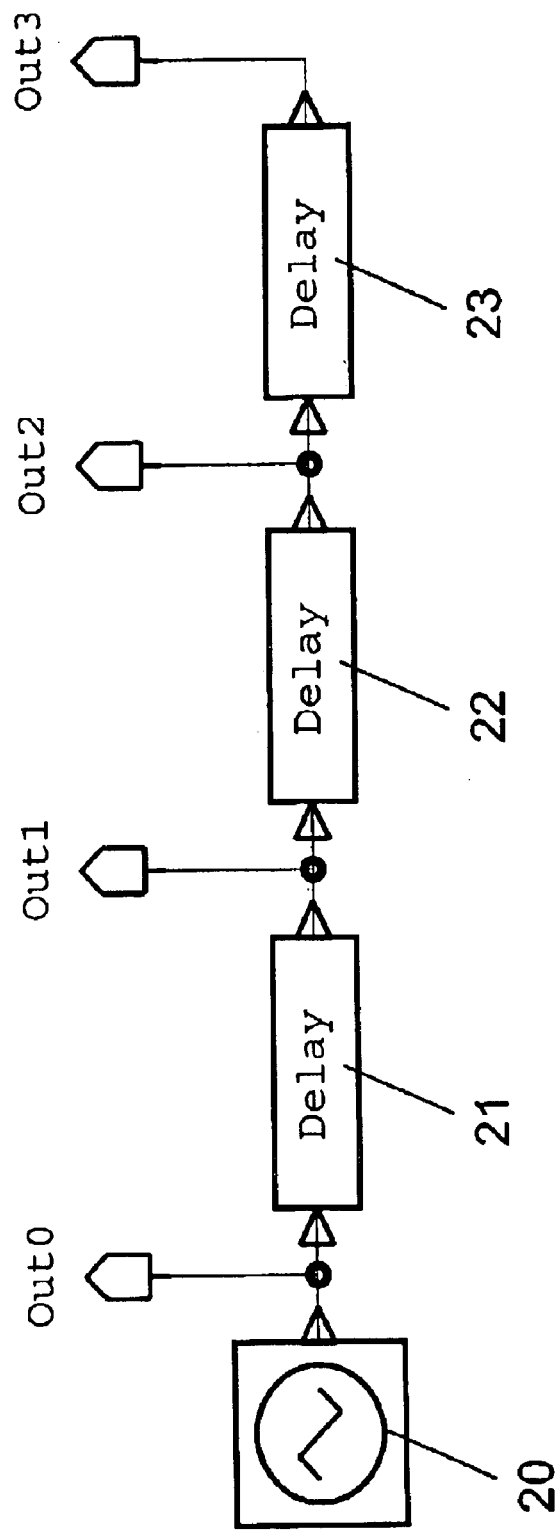
FIG. 2 is a second schematic block diagram of a known digitally controlled phase modulating system.

FIGS. 1 and 2 have already been described above.

FIGS. 3 to 10 illustrate six different embodiments of a phase modulating system according to the invention. The phase modulating systems of FIGS. 3 to 5 constitute three different possibilities of constructing a delay line. The phase modulating systems of FIGS. 6 to 9 constitute two different possibilities of employing a reduced delay line and of approximating the remaining delay. The phase modulating system of FIG. 10 constitutes a possibility of using a single delay line for modulating signals of different frequencies.

Figure 3:
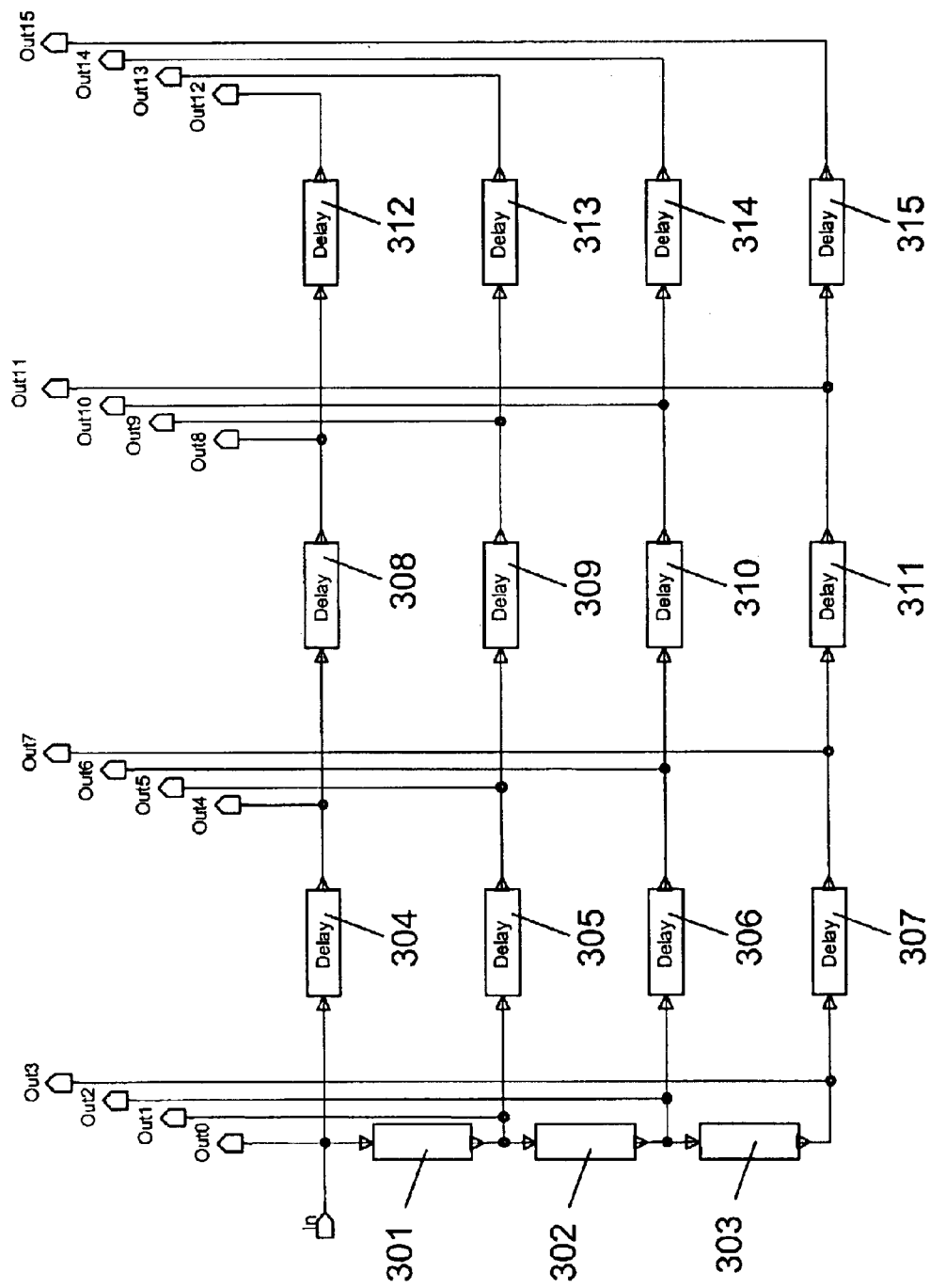
FIG. 3 is a schematic block diagram of a first embodiment of a phase modulating system according to the invention.

The first embodiment of a phase modulating system according to the invention is presented in the schematic block diagram of FIG. 3. This embodiment is based on the use of a delay matrix as a delay line, in order to reduce the required number of very short delays.

The phase modulating system of FIG. 3 is a 4-bit system, in which a clock generator (not shown) is connected to an input 'In' of a delay matrix. The clock generator generates a clock signal having a period of $T_c$. Thus, 16 signals which are delayed in steps of $T_c/16$ are required.

Within the delay matrix, the input 'In' is connected to a delay element 301, which is further connected to a delay element 302, which is further connected to a delay element 303.

The input 'In' is moreover connected to a delay element 304, which is further connected to a delay element 308, which is further connected to a delay element 312. The output of the delay element 301 is moreover connected to a delay element 305, which is further connected to a delay element 309, which is further connected to a delay element 313. The output of the delay element 302 is moreover connected to a delay element 306, which is further connected to a delay element 310, which is further connected to a delay element 314. The output of the delay element 303 is moreover connected to a delay element 307, which is further connected to a delay element 311, which is further connected to a third delay element 315.

Only the delay of delay elements 301, 302 and 303 is equal to the required minimum delay of $T_c/16$, the delay of the other delay elements 304 to 315 being four times as big, i.e. $T_c/4$.

The input 'In' constitutes at the same time a first output Out0, while the output of the delay elements 301 to 315 constitute outputs Out1 to Out15, respectively. The outputs Out0 to Out15, which are thus arranged in form of a matrix, are provided to a switching component (not shown).

The phase modulating system of FIG. 3 operates as follows.

The clock generator provides a clock signal to the input 'In' of the delay matrix. In the delay matrix, the clock signal passes through the various branches and is delayed by each of the delay elements 301 to 315. The resulting output signals at outputs Out0 to Out15 have been delayed between a delay of 0 and a delay of $T_c-(T_c/16)$ in steps of $T_c/16$, even though only 3 of the 15 delay elements 301 to 315 apply such a short delay to the respectively received clock signal.

The switching component then selects one of the signals at outputs Out0 to Out15 as output signal of the entire phase modulating system according to a provided digital 4-bit control signal. That is, each possible value of the provided 4-bit word between 0 and 15 results in an output signal with another delay.

Since the delay matrix of FIG. 3 decreases the required number of very short delays compared e.g. to the delay line of FIG. 2, these short delays can be implemented using a technology that is different from the technology employed for the rest of the delays.

While FIG. 3 illustrates a 4-bit system, the delay matrix can also be constructed in other sizes. Preferably, the number of bits n of the employed control signal is even. In this case, the number of outputs of the delay matrix is $2^{2n_1}=2^{n_1}2^{n_1}$, with $n=2n_1$, and these outputs are arranged as a $2^{n_1}$ times $2^{n_1}$ matrix. The short delays are $T_c/2^n$, and the longer delays are $2^{n_1}$ as long, i.e. $T_c/2^{n_1}$.

Figure 4:
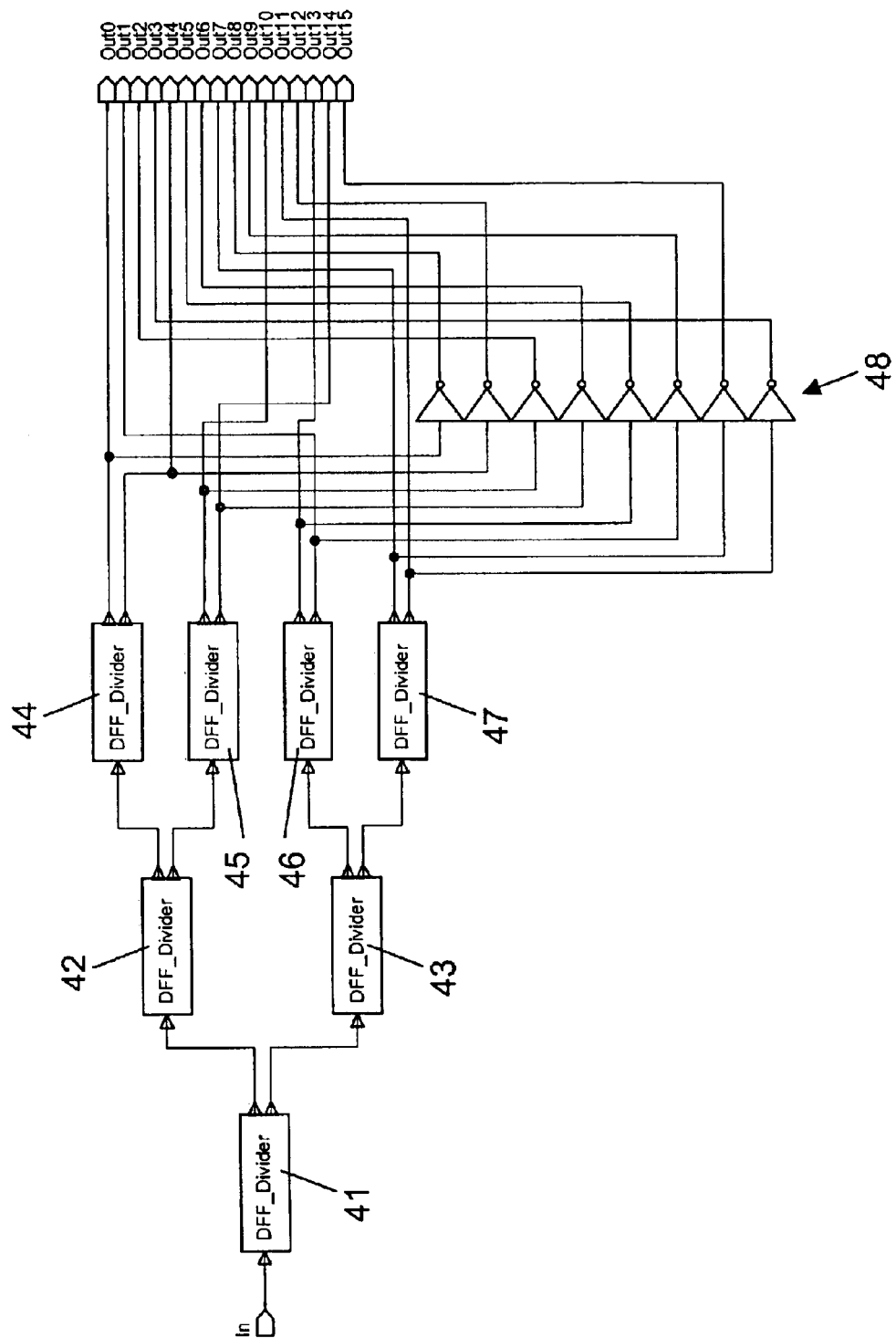
FIG. 4 is a schematic block diagram of a second embodiment of a phase modulating system according to the invention.

The second embodiment of a phase modulating system according to the invention is presented in the schematic block diagram of FIG. 4. This embodiment is based on the use of digital frequency dividers for constructing a delay line, in order to avoid the necessity of very short delays.

The phase modulating system of FIG. 4 is a 4-bit system. It comprises a clock generator (not shown), the output of which is connected to the input 'In' of a phasing arrangement with cascaded frequency dividers. The input signal frequency, provided e.g. by an oscillator, can be tuned as desired. The frequency dividers can be for example D flip-flops DFF, but other suitable circuits could be used as well.

More specifically, the input 'In' of the phasing arrangement is connected to the input of a first digital frequency divider 41 forming a first divide-by-two frequency division stage.

A first output of the first digital frequency divider 41 is connected to an input of a second digital frequency divider 42 and a second output of the first digital frequency divider 41 is connected to an input of a third digital frequency divider 43. The second and the third digital frequency dividers 42, 43 form a second divide-by-two frequency division stage.

A first output of the second digital frequency divider 42 is connected to an input of a fourth digital frequency divider 44 and a second output of the second digital frequency divider 42 is connected to an input of a fifth digital frequency divider 45. A first output of the third digital frequency divider 43 is connected to an input of a sixth digital frequency divider 46 and a second output of the third digital frequency divider 43 is connected to an input of a seventh digital frequency divider 47. The fourth to seventh digital frequency dividers 44, 45, 46, 47 form a third divide-by-two frequency division stage.

A first and a second output of the fourth digital frequency divider 44 are connected directly to an output Out0 and an output Out4, respectively. The same two outputs of the fourth digital frequency divider 44 are connected in addition via a respective not-circuit 48 to an output Out9 and an output Out12, respectively. A first and a second output of the fifth digital frequency divider 45 are connected directly to an output Out10 and an output Out14, respectively. The same two outputs of the fifth digital frequency divider 45 are connected in addition via a respective not-circuit 48 to an output Out2 and an output Out6, respectively. A first and a second output of the sixth digital frequency divider 46 are connected directly to an output Out13 and an output Out1, respectively. The same two outputs of the sixth digital frequency divider 46 are connected in addition via a respective not-circuit 48 to an output Out9 and an output Out12, respectively. A first and a second output of the seventh digital frequency divider 47 are connected directly to an output Out7 and an output Out11, respectively. The same two outputs of the seventh digital frequency divider 47 are connected in addition via a not-circuit 48 to output Out15 and Out3.

Outputs Out0 to Out15 are connected to a switching component (not shown).

The phase modulating system of FIG. 4 operates as follows.

The clock generator provides a sinusoidal clock signal to the input 'In' of the phasing arrangement. Since three divide-by-two frequency division stages are provided, the provided clock frequency must be eight times higher than the desired output frequency.

Each of the digital frequency dividers 41 to 47 receives a signal with another phase angle from the input 'In' or from a digital frequency divider of the preceding divide-by-two frequency division stage and accomplishes a 90-degree phase shift between its two outputs.

By using the seven digital frequency dividers 44 to 47 in cascade and by providing in addition an inverted version of the output signal of each of the digital frequency dividers 44 to 47 of the last divide-by-two frequency division stage, in the whole, a 22.5 degree resolution is achieved. This corresponds to a resolution of 4-bit represented by outputs Out0 to Out15.

The switching component then selects the signal at one of the outputs Out0 to Out15 as the output signal of the entire phase modulating system according to a provided digital 4-bit control signal. That is, each possible value of the provided 4-bit word between 0 and 15 results in an output signal with another delay.

The arrangement of FIG. 4 ensures that the phase changes by the minimum step from one output to the next are in the order of the outputs Out0 to Out15. This facilitates the control of the switching component.

Instead of using separate not-circuits 48 for inverting the output signals of the last frequency division stage, the fourth to seventh digital frequency dividers 44 to 47 may include non-inverting and inverting outputs.

Obviously, the achieved resolution can be adjusted by selecting the number of frequency division stages and the frequency of the provided clock signal accordingly.

Figure 5:
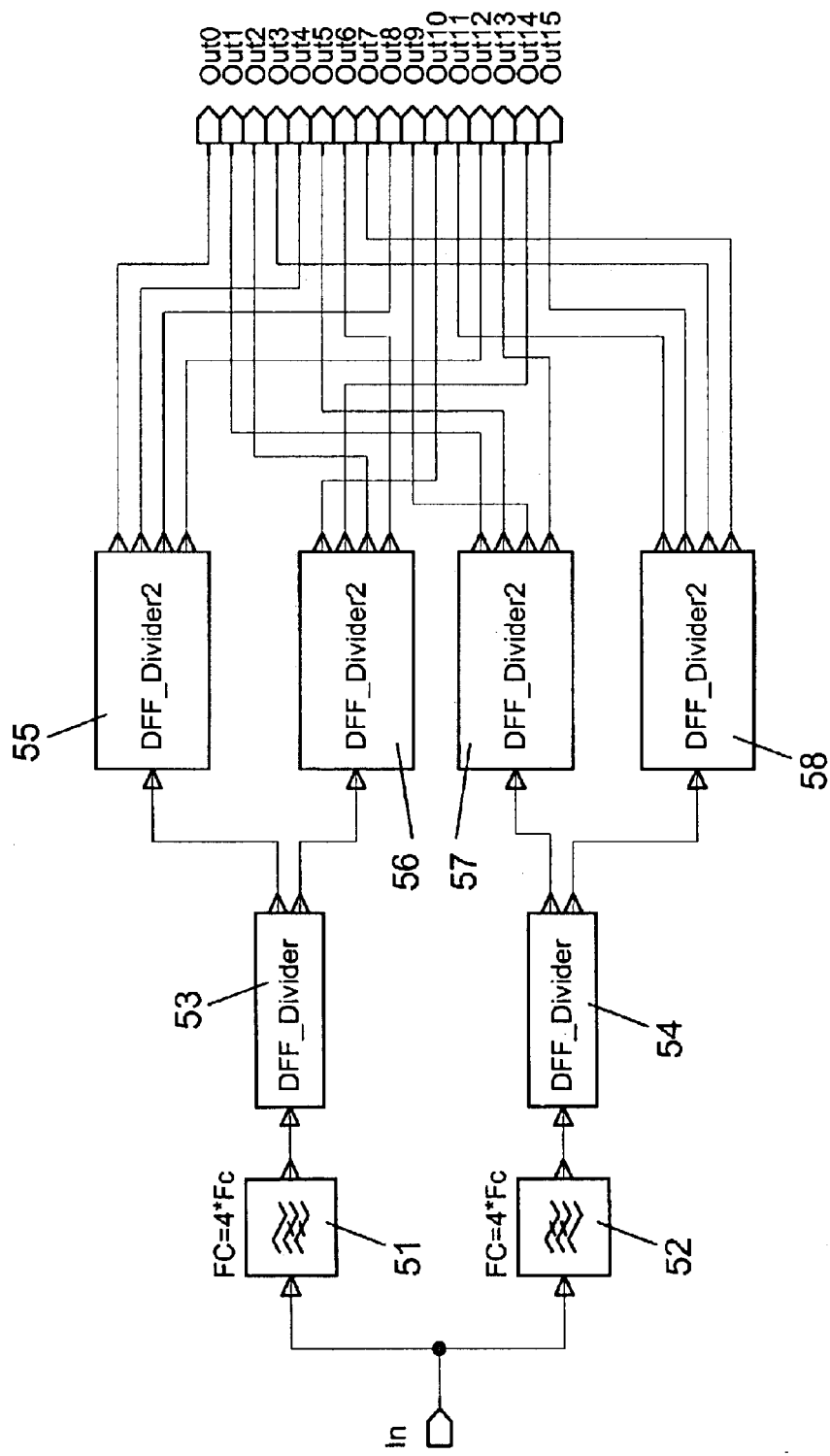
FIG. 5 is a schematic block diagram of a third embodiment of a phase modulating system according to the invention.

The third embodiment of a phase modulating system according to the invention is presented in the schematic block diagram of FIG. 5. This embodiment constitutes a variation of the second embodiment described with reference to FIG. 4.

Like the second embodiment, the third embodiment comprises three divide-by-two frequency division stages.

In contrast to the second embodiment, however, the first divide-by-two frequency division stage comprises two analog phase shifters 51, 52 instead of a digital frequency divider 41. The two analog phase shifters 51, 52 accomplish an initial division of an input signal to two signals with a phase difference of 90 degrees. The first analog phase shifter 51 is realized by a high pass filter and the second analog phase shifter 52 is realized by a low pass filter.

The second divide-by-two frequency division stage comprises two digital frequency dividers 53, 54, just like the second divide-by-two frequency division stage of the second embodiment.

The third divide-by-two frequency division stage comprises four digital frequency dividers 55 to 58, just like the third divide-by-two frequency division stage of the second embodiment. In the third embodiment, however, the digital frequency dividers 55 to 58 of the third divide-by-two frequency division stage include in addition to two non-inverting outputs equally two inverting outputs, all outputs being connected directly to outputs Out0 to Out15. Thus, separate not-circuits as employed in the phase modulating system of FIG. 4 are not required.

The phase modulating system of FIG. 5 operates analogously as described for the phase modulating system of FIG. 4, but the analog phase shifters 51, 52 allow a reduction in the clock frequency. More specifically, the required oscillator frequency FC is four times higher than the output frequency Fc. The phase modulating system of FIG. 4, on the other hand, has the advantage over phase modulating system of FIG. 5 that in case of changing frequencies, the output amplitudes of the two analog phase shifters 51, 52 of the phase modulating system of FIG. 5 vary, i.e. as one increases, the other decreases, while the phase difference between the outputs remains fixed. Another advantage of the phase modulating system of FIG. 4 might be the process variation of the component values in the analog phase shifters 51, 52 of the phase modulating system of FIG. 5.

Figure 6:
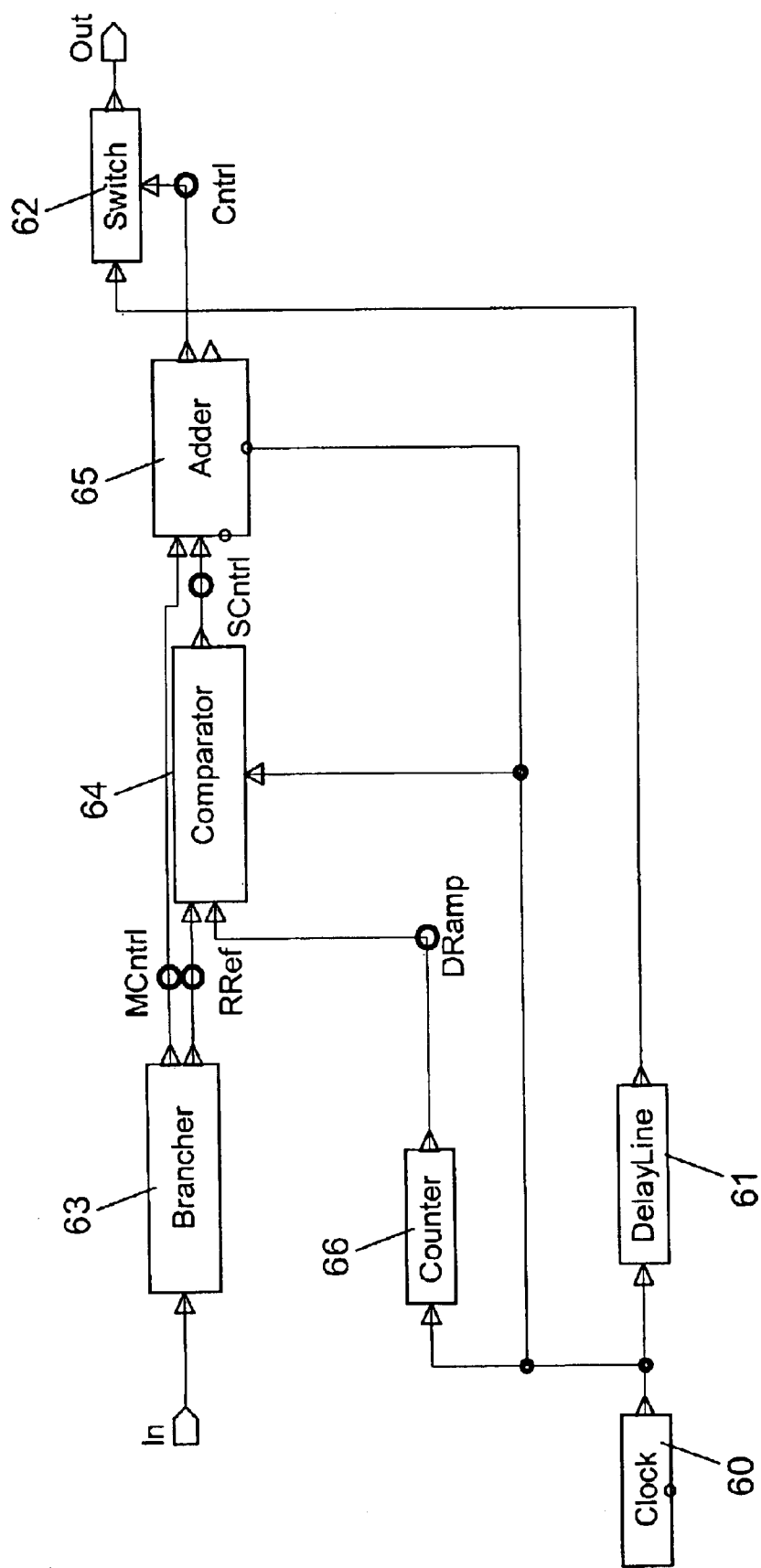
FIG. 6 is a schematic block diagram of a fourth embodiment of a phase modulating system according to the invention.

The fourth embodiment of a phase modulating system according to the invention is presented in the schematic block diagram of FIG. 6. This embodiment is based on approximating part of an n-bit control signal for reducing the number of very short delays. By way of example, n is assumed to be equal to 8.

The phase modulating system of FIG. 6 comprises a clock generator 60, the output of which is connected to a delay line 61. The delay line 61 comprises $2^k-1$ delay elements connected in series, similarly as depicted in FIG. 2. The parameter k represents the number of most significant bits of the n-bit control signal. By way of example, k is assumed to be equal to 4, thus the delay line 61 comprises 15 delay elements. The input to the first delay element and the output of each of the delay elements are provided to a signal input of a switch 62. Alternatively, the delay line 61 could be realized in any other suitable manner providing a corresponding number of delayed signals, e.g. by the arrangement between oscillator and outputs in one of FIGS. 3 to 5.

Further, a control input terminal 'In' is connected to a brancher 63. A first output of the brancher 63 is connected to a first signal input of a adder 65, and a second output of the brancher 63 is connected to a first signal input of a comparator 64. The output of the comparator 64 is connected to a second signal input of the adder 65. An output of the adder 65 is connected to a control input of the switch 62. A second output of the adder 65 is Carry, which is not needed here. The brancher 63, the comparator 64 and the adder 65 are suited to process digital bus signals.

Finally, the output of the clock generator 60 is connected in addition to a clock input of a binary (n−k)-bit counter 66 and to a respective clock input of the comparator 64 and of the adder 65.

Figure 7:
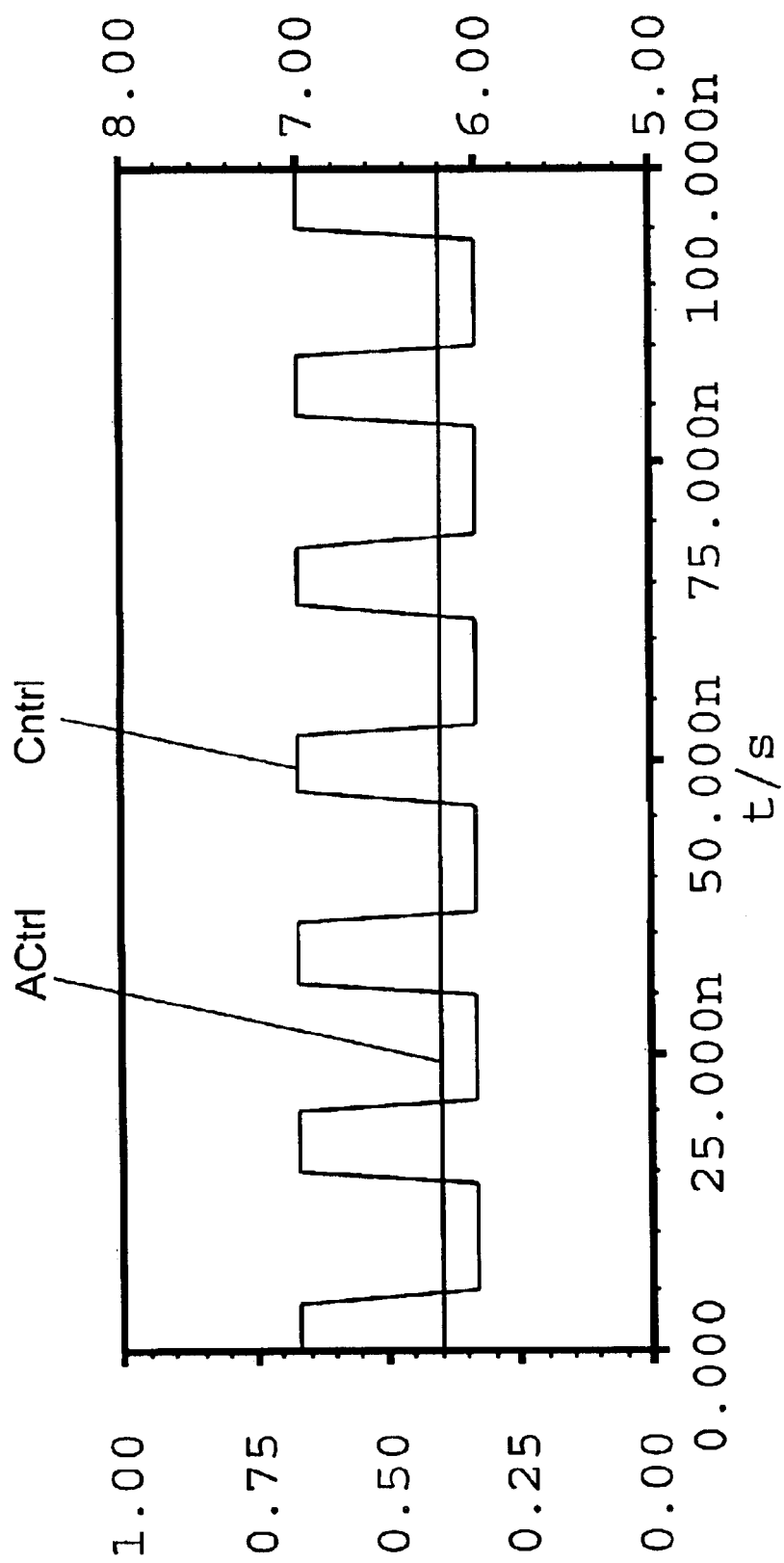
FIG. 7 is a diagram presenting control signals in the phase modulating system of FIG. 6.
Figure 8:
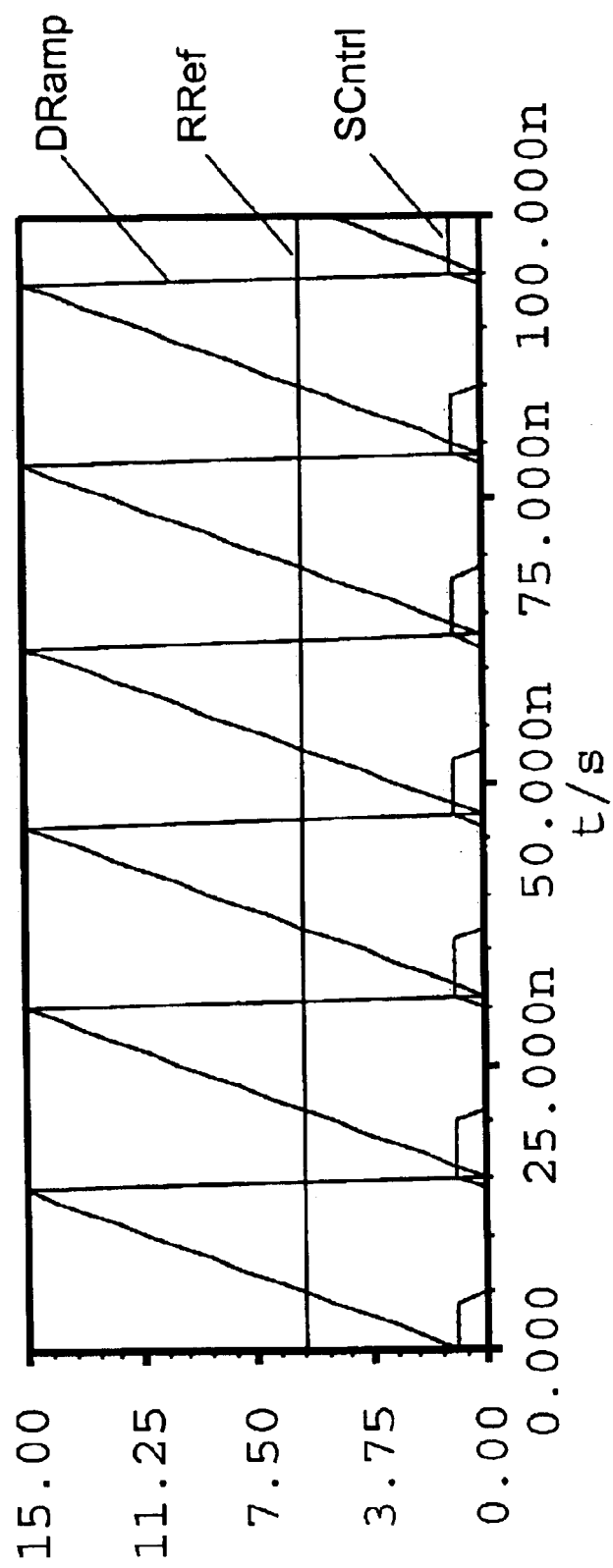
FIG. 8 is a diagram presenting an auxiliary signal and further control signals in the phase modulating system of FIG. 6.

The operation of the phase modulating system of FIG. 6 will be described in the following with reference to FIGS. 7 and 8 for the example of n=8 and k=4.

A constant analog signal of 0.4V represents the currently desired phase shift of a clock signal in an arbitrary range between 0V and 1V. The signal is depicted in FIG. 7 as signal ACtrl over a time span of 100 ns, the corresponding amplitude scale being indicated on the left hand side of the diagram. The analog signal is digitized in the range 0 . . . 1 using n=8 bits. The resulting control signal is provided via input terminal 'In' to the brancher 63. The brancher 63 separates the received control signal into a first signal MCntrl comprising the k=4 most significant bits of the n-bit control signal and a second signal RRef comprising the n−k=4 least significant bits of the n-bit control signal. The brancher 63 provides the signal MCtrl to the first signal input of the adder 65 and the signal RRef to the first signal input of the comparator 64. The signal RRef is depicted in FIG. 8 over a time span of 100 ns.

At the same time, the clock generator 60 provides a clock signal that is to be modulated to the delay line 61. The clock signal has a period of $T_c$. The clock signal is delayed by the $2^k-1=15$ delay elements of the delay line 61, and the delay line 61 provides the original clock signal and the 15 delayed clock signals to the switch 62.

In addition, the clock generator 60 provides the same clock signal to a clock input of the 4-bit counter 66, of the comparator 64 and the adder 65.

The 4-bit counter 66 produces a digital saw wave by counting with the clock frequency of the clock signal applied to its clock input from 0 to 15. The resulting saw wave DRamp, which is provided to the second signal input of the comparator 64, is depicted in FIG. 8 over a time span of 100 ns.

The saw wave DRamp is then compared by the comparator 64 with the constant signal RRef. The comparator 64 outputs a logic high level signal SCntrl of 1, whenever the value of the signal RRef is larger than the value of the saw wave DRamp, and a logic low level signal SCntrl of 0, whenever the value of the signal RRef is smaller than the value of the saw wave DRamp. The signal SCntrl, which is equally depicted in FIG. 8 over a time span of 100 ns, is provided by the comparator 64 to the second signal input of the adder 65.

The adder 65 then adds the comparator output bit SCntrl to the 4 most significant bits MCntrl of the modulating signal. The four most significant bits of the modulating signal represent 6, but since the value of the four least significant bits is non-zero, the switch control signal Cntrl varies between 6 and 7, as shown in the diagram of FIG. 7 over a time span of 100 ns, the amplitude scale for this signal being indicated on the right hand side of the diagram. For taking care of the case that the four most significant bits MCntrl already assume their highest possible value before the summing in the adder 65, a modulo n−k property is provided to the adder 65 so that the result $2^{n-k}$ is mapped to 0. Thereby, the output Cntrl of the adder 65 alternate in the mentioned case between the highest and the lowest possible value of MCntrl, making use of the periodicity of the clock signal.

In the current example, the output Cntrl of the adder 65 controls the switch 62 to select alternately the sixth and the seventh signal of the 16 signals provided by the delay line 61 to the switch 62.

Thus, an approximation makes the switch 62 select the delay line output alternately between the position determined by the most significant k bits and the next position in a way that corresponds on an average to the effect of the least significant n−k bits.

While in the embodiment of FIG. 6, the clock signal provided to the delay line 61 is used at the same time as a clock for the counter 66, the comparator 64 and the adder 65, other clock frequencies can be used as well. The number of bits in the counter together with its clock frequency determines the frequency of its output saw wave. If this frequency is too slow, the output spectrum may be deteriorated close to the modulated carrier. Therefore, it may be desirable in some cases to use an even higher frequency clock than the output carrier. Alternatively, it might be helpful to scramble the counter output words in a way that randomizes the corresponding modulation effect.

Instead of the counter 66 and the comparator 64 in the embodiment of FIG. 6, e.g. a sigma-delta modulator could be used for accomplishing the averaging. This would allow the well-known noise shaping options related to sigma-delta modulators.

Figure 9:
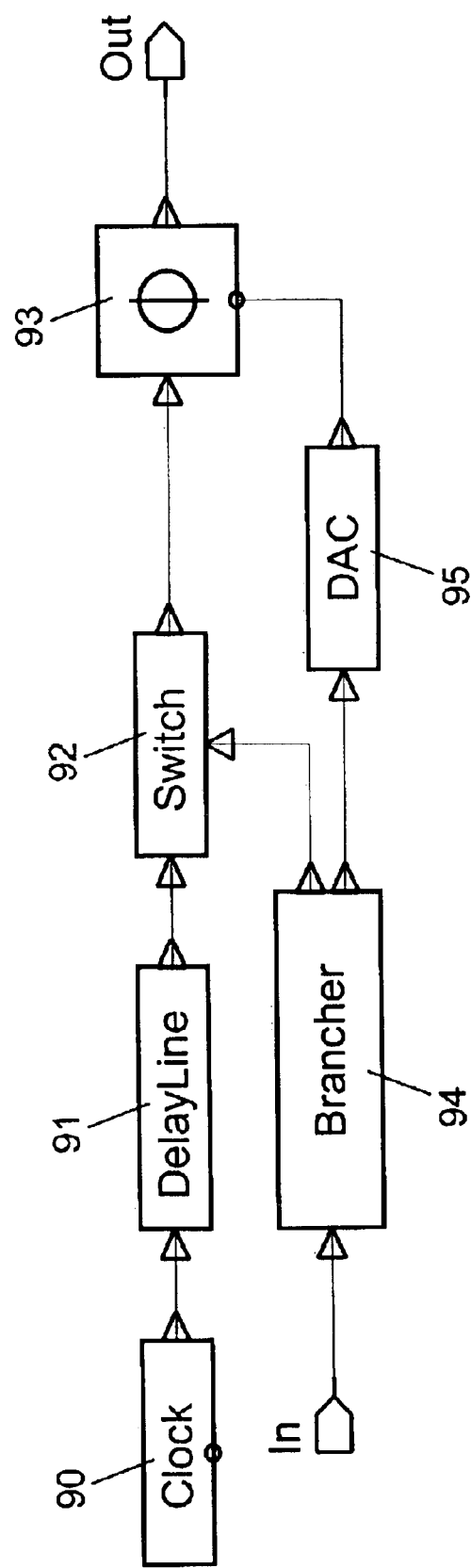
FIG. 9 is a schematic block diagram of a fifth embodiment of a phase modulating system according to the invention.

The fifth embodiment of a phase modulating system according to the invention is presented in the schematic block diagram of FIG. 9. This embodiment is based on a combination of a delay line and an analog phase shifter for reducing the number of very short delays.

The phase modulating system of FIG. 9 comprises a clock generator 90, the output of which is connected to a delay line 91. The output of the delay line 91 is connected to a signal input of a switch 92. The output of the switch 92 is connected via an analog phase shifter 93 to an output terminal 'Out' of the system. Further, an input terminal 'In' is connected to a brancher 94. A first output of the brancher 94 is connected to a control input of the switch 92 and a second output of the brancher 94 is connected via a digital-to-analog converter DAC 95 to a control input of the analog phase shifter 93.

The delay line is composed of $2^k-1$ delay elements connected in series, similarly as shown in FIG. 2. Thus, the input to the first delay element and the output of each delay element are connected to the switch 92. Alternatively, the delay line could be realized in any other suitable manner providing a corresponding number of delayed signals, e.g. by the arrangement between oscillator and outputs in one of FIGS. 3 to 5.

The phase modulating system of FIG. 9 operates as follows.

The clock generator 90 provides a clock signal having a period $T_c$ to the delay line 91. The clock signal is delayed by the $2^k-1$ delay elements of the delay line 91, and the delay line 91 provides the original clock signal and the $2^k-1$ delayed signals to the switch 92.

Further, a digital n-bit control signal representing the currently desired modulation of the clock signal is provided via the input terminal 'In' to the brancher 94. The brancher 94 separates the received binary control signal into a first part comprising the k most significant bits of the n-bit control signal and a second part comprising the n−k least significant bits of the n-bit control signal.

The brancher 94 then provides the k most significant bits as k-bit control signal to the control input of the switch 92. Each possible value of the k-bit control signal is associated to another one of the $2^k$ clock signals provided to the switch 92. The switch 92 selects one of the $2^k$ received clock signals according to the value of the received k-bit control signal and forwards the selected signal to the signal input of the analog phase shifter 93.

The brancher 94 further provides the n−k least significant bits of the n-bit control signal to the digital-to-analog converter 95, which converts the binary signal into a corresponding analog signal. This analog signal is applied to the control input of the analog phase shifter 93.

The analog phase shifter 93 shifts the phase of the signal received from the switch 92 according to the value of the received analog control signal and provides the resulting clock signal having the desired total delay to the output terminal 'Out'. There is a linear correlation between the analog control signal and the shift applied by the analog phase shifter 93 in response to the received analog control signal.

When combining a delay line 91 with an analog phase shifter 93 as in FIG. 9, it is important that the phase shifts due to the delay line and the analog phase shifter are matched, lest the full advantage of using the least significant bits will be lost. One problem is the extra delay in the analog line. This is one reason for omitting the reconstruction filter after the digital-to-analog converter 95, which is conventionally included when employing a digitally controlled pure analog phase shifter. Another reason for omitting the reconstruction filter is that a digital-to-analog converter output signal can have abrupt changes, thus its spectrum is very wide and could be distorted by a filter.

When using a conventional analog phase shifter, a problem arises from the fact that the phase shift of an analog phase shifter does generally not follow its control voltage linearly. With the proposed system of FIG. 9, however, this can be circumvented to a great extent, when the phase shifting range in the analog phase shifter is selected to be quite small, while the digital phase shifter takes care of a wide range phase shift.

Figure 10:
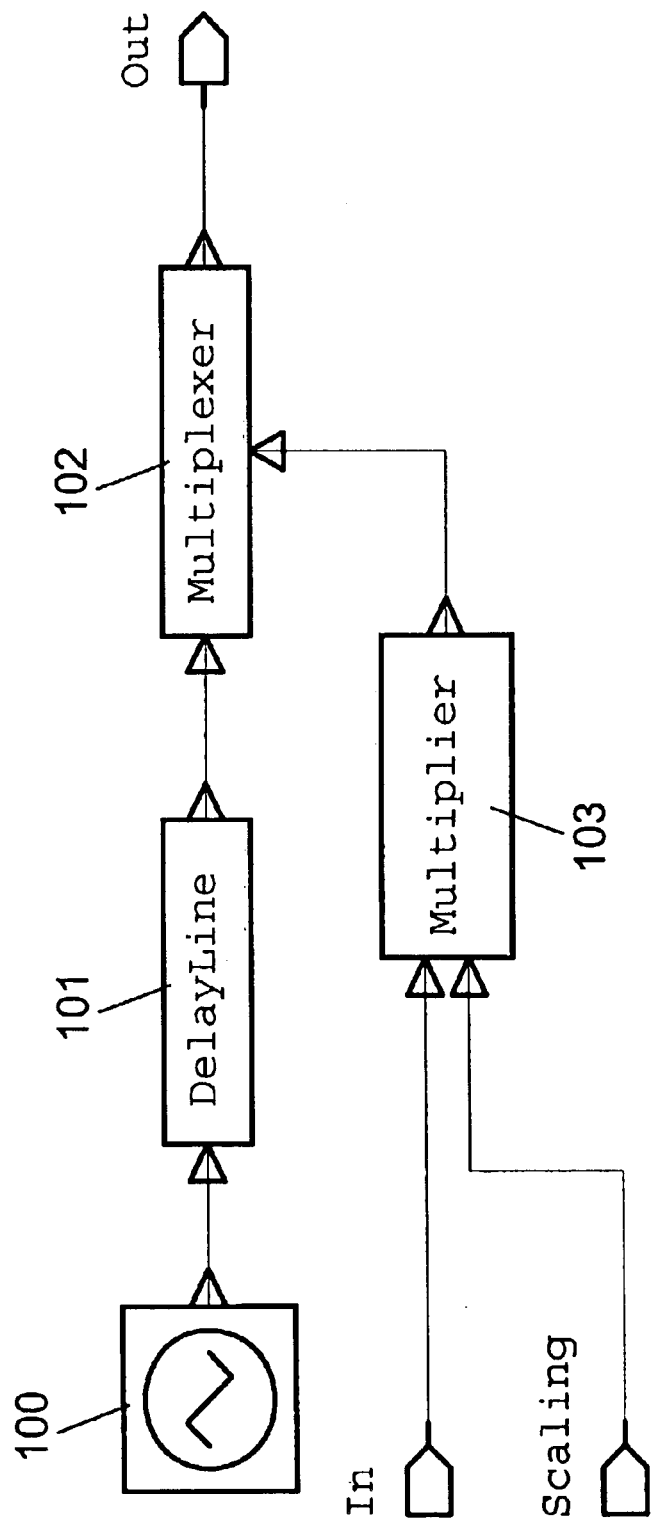
FIG. 10 is a schematic block diagram of a sixth embodiment of a phase modulating system according to the invention.

The sixth embodiment of a phase modulating system according to the invention is presented in the schematic block diagram of FIG. 10. This embodiment can be employed for modifying the phase of signals of various frequencies without increasing the number of very short delays.

The phase modulating system of FIG. 10 comprises an oscillator 100, the output of which is connected to a delay line 101. The oscillator 100 is able to provide to the delay line 101 periodic signals of various frequencies lying in between a required lowest frequency and a required highest frequency. The output of the delay line 101 is connected via a multiplexer 102 to an output terminal 'Out' of the system.

The delay line 101 is composed of a plurality of delay elements connected in series, similarly as shown in FIG. 2. The input to the first delay element and the output of each delay element are provided to the multiplexer 102. The delay applied by each of the delay elements and the number of delay elements is selected such that the maximum delay covers one period of the lowest frequency of the oscillator signal, this signal having the longest period. Alternatively, the delay line 101 may be realized in any other suitable manner providing a corresponding number of delayed signals, e.g. by the arrangement between oscillator and outputs in FIG. 3.

Further, a control input terminal 'In' and a scaling input terminal 'Scaling' are connected to inputs of a multiplier 103. The output of the multiplier 103 is connected to a control input of the multiplexer 102.

The phase modulating system of FIG. 10 operates as follows.

The oscillator 100 provides a signal of a selected one of the allowed frequencies to the delay line 101. The delay line 101 delays the received signal and provides a plurality of output signals of different phases. The number of output signals is equal to the number of delay elements plus one.

At the same time, a digital n-bit control signal is provided to the input terminal 'In' and a scaling factor is provided to the scaling input terminal 'Scaling'. The control signal represents the currently desired phase shift of the oscillator signal, while the scaling factor is related to the current frequency of the oscillator signal. The scaling factor is selected such that it is 1 for the lowest enabled frequency, and it decreases with rising frequencies. For example, in GSM1800, the transmit band is 1710 to 1785 MHz. Hence, a scaling factor of 1 would be associated to the lowest frequency of 1710 MHz. The mean value, e.g., is 1747.5 MHz. The ratio of the lowest frequency to the mean value is 1710/1747.5=0.9785, thus a scaling factor of 0.9785 would be used for the mean frequency of 1747.5 MHz.

The provided digital control signal is multiplied by the multiplier 103 with the provided scaling factor, and the multiplier 103 provides the scaled digital control signal to the control input of the multiplexer 102. For example, in case the lowest enabled frequency is selected, the multiplier 103 multiplies the original n-bit digital control signal by one and provides thus the original n-bit digital control signal to the multiplexer 102. In case a frequency is selected which is twice as high as the lowest enabled frequency, the multiplier 103 multiplies the original n-bit digital control signal by ½, thereby reducing the number of bits by 2. The multiplier 103 thus provides a new n/2-bit control signal to the multiplexer 102.

Generally speaking, the multiplier 103 changes the range of the modulating signal by multiplying it by a suitable number that is related to the desired frequency change before providing it to the multiplexer 102.

The multiplexer 102, which is used as a switching component, then selects one of the signals received from the delay line 101 according to the received scaled control signal. Due to the scaling of the control signal and thus of the addressing range, at higher frequencies (shorter periods) only part of the output signals of the delay line can be selected. It has to be taken into account that the relative resolution decreases at the higher frequencies.

While there have shown and described and pointed out fundamental novel features of the invention as applied to a preferred embodiment thereof, it will be understood that various omissions and substitutions and changes in the form and details of the devices and methods described may be made by those skilled in the art without departing from the spirit of the invention. For example, it is expressly intended that all combinations of those elements which perform substantially the same function in substantially the same way to achieve the same results are within the scope of the invention. Moreover, it should be recognized that structures and/or elements and/or method steps shown and/or described in connection with any disclosed form or embodiment of the invention may be incorporated in any other disclosed or described or suggested form or embodiment as a general matter of design choice. It is the intention, therefore, to be limited only as indicated by the scope of the claims appended hereto.

What is claimed is:

1. A phase modulating system for modulating the phase of a signal based on a digital control signal, said phase modulating system comprising:

signal input for receiving a signal which is to be modulated;

connected to said signal input x delay elements connected to each other in series, with $x \geq 1$, each of said x delay elements applying a delay of D to a respectively received signal;

connected to said signal input y delay elements connected to each other in series, with $y \geq 1$, each of said y delay elements applying a delay of $D*(x+1)$ to a respectively received signal;

connected to an output of at least one of said x delay elements at least one further delay element, wherein in case more than one further delay element is connected to the output of any of said x delay elements, said respective further delay elements being connected to each other in series, each of said further delay elements applying a delay of $D*(x+1)$ to a respectively received signal; and a switching component selecting the signal at one of the signal input and the output of one of the x, y and further delay elements in accordance with said digital control signal as a phase modulated output signal.

2. A phase modulating system for modulating the phase of a signal based on a digital control signal, said phase modulating system comprising:

signal input for receiving a signal which is to be modulated;

connected to said signal input x delay elements connected to each other in series, with x≧1, each of said x delay elements applying a delay of D to a respectively received signal;

connected to said signal input y delay elements connected to each other in series, with y≧1, each of said y delay elements applying a delay of D*(x+1) to a respectively received signal;

connected to an output of zero or more of said x delay elements at least one further delay element, wherein in case more than one further delay element is connected to the output of any of said x delay elements, said respective further delay elements being connected to each other in series, each of said further delay elements applying a delay of D*(x+1) to a respectively received signal; and a switching component selecting the signal at one of the signal input and the output of one of the x, y and further delay elements in accordance with said digital control signal as a phase modulated output signal, wherein said digital control signal comprises n bits, n being an even entire number, wherein x is equal to n/2−1, wherein y is equal to n/2, wherein each of said series of further delay elements comprises n/2 delay elements, and wherein D is equal to the period of said signal, which is to be modulated, divided by $2^n$.

3. A method of modulating the phase of a signal based on a digital control signal, said method comprising:

receiving said signal which is to be modulated;

delaying said received signal in sequence by x delay elements, with x≧1, each of said x delay elements applying a delay of D to a respectively received signal;

delaying said received signal in sequence by y delay elements, with y≧1, each of said y delay elements applying a delay of D*(x+1) to a respectively received signal;

delaying the signal output by at least one of said x delay elements in sequence by at least one further delay element, each of said further delay elements applying a delay of D*(x+1) to a respectively received signal; and selecting one of said received signal and a delayed signal output by one of said x, y and further delay elements in accordance with said digital control signal as a phase modulated output signal.

4. A chase modulating system for modulating the phase of a signal based on a digital control signal, said phase modulating system comprising:

signal input for receiving a signal which is to be modulated;

connected to said signal input x delay elements connected to each other in series, with x≧1, each of said x delay elements applying a delay of D to a respectively received signal;

connected to said signal input y delay elements connected to each other in series, with y≧1, each of said y delay elements applying a delay of D*(x+1) to a respectively received signal;

connected to an output of zero or more of said x delay elements at least one further delay element, wherein in case more than one further delay element is connected to the output of any of said x delay elements, said respective further delay elements being connected to each other in series, each of said further delay elements applying a delay of D*(x+1) to a respectively received signal; and a switching component selecting the signal at one of the signal input and the output of one of the x, y and further delay elements in accordance with said digital control signal as a phase modulated output signal, wherein said digital control signal is a digital n-bit control signal;

wherein said signal input, said x delay elements, said y delay elements and said further delay elements form a delay arrangement delaying said signal which is to be modulated to obtain at the signal input and the output of the x, y and further delay elements $2^k$ signals of different phase angles, where k corresponds to a number of most significant bits of said n-bit control signal;

wherein said phase modulating system further comprises an approximation arrangement generating a further digital control signal out of said digital n-bit control signal, said further digital control signal alternating between the value of said first k most significant bits of said digital n-bit control signal and the value of said first k most significant bits incremented by one, the value of said further digital control signal corresponding on an average to the value of said digital n-bit control signal; and wherein said switching component selects alternately two of said $2^k$ signals obtained in said delay arrangement in accordance with said further digital control signal as a phase modulated output signal.

5. The phase modulating system according to claim 4, wherein said approximation arrangement includes a counter, a comparator and an adder, said counter generating a saw wave with a respective rising ramp increasing from zero to $2^{n-k}-1$, said comparator comparing said saw wave with the value of the n−k least significant bits of said n-bit control signal and outputting an indication whether the value of said n−k least significant bits is larger than the value of said saw wave, and said adder incrementing the value of said k most significant bits of said control signal by one whenever said comparator indicates that the value of said n−k least significant bits is larger than the value of said saw wave and providing the result as said further control signal.

6. A method of modulating the phase of a signal based on a digital control signal, said method comprising:

receiving said signal which is to be modulated;

delaying said received signal in sequence by x delay elements, with x≧1, each of said x delay elements applying a delay of D to a respectively received signal;

delaying said received signal in sequence by y delay elements, with y≧1, each of said y delay elements applying a delay of D*(x+1) to a respectively received signal;

delaying the signal output by zero or more of said x delay elements in sequence by at least one further delay element, each of said further delay elements applying a delay of D*(x+1) to a respectively received signal; and selecting one of said received signal and a delayed signal output by one of said x, y and further delay elements in accordance with said digital control signal as a phase modulated output signal, wherein said digital control signal is a digital n-bit control signal;

wherein said delaying steps delay said signal which is to be modulated to obtain $2^k$ signals of different phase angles at a signal input to said x delay elements and a respective output of the x, y and further delay elements, where k corresponds to a number of most significant bits of said n-bit control signal;

wherein said method further comprises generating a further digital control signal out of said digital n-bit control signal, said further digital control signal alternating between the value of said first k most significant bits of said digital n-bit control signal and the value of said first k most significant bits incremented by one, the value of said further digital control signal corresponding on an average to the value of said digital n-bit control signal; and wherein said selection step comprises selecting alternately two of said $2^k$ signals of different phase angles in accordance with said further digital control signal as a phase modulated output signal.

7. A phase modulating system for modulating the phase of a signal based on a digital control signal, said phase modulating system comprising:

signal input for receiving a signal which is to be modulated;

connected to said signal input x delay elements connected to each other in series, with $x \geq 1$, each of said x delay elements applying a delay of D to a respectively received signal;

connected to said signal input y delay elements connected to each other in series, with $y \geq 1$, each of said y delay elements applying a delay of $D*(x+1)$ to a respectively received signal;

connected to an output of zero or more of said x delay elements at least one further delay element, wherein in case more than one further delay element is connected to the output of any of said x delay elements, said respective further delay elements being connected to each other in series, each of said further delay elements applying a delay of $D*(x+1)$ to a respectively received signal; and a switching component selecting the signal at one of the signal input and the output of one of the x, y and further delay elements in accordance with said digital control signal as a phase modulated output signal, wherein said digital control signal is a digital n-bit control signal;

wherein said signal input, said x delay elements, said y delay elements and said further delay elements form a delay arrangement delaying said signal which is to be modulated to obtain at the signal input and the output of the x, y and further delay elements $2^k$ signals of different phase angles, where k corresponds to a number of most significant bits of said n-bit control signal;

wherein said switching component selects and forwards one of $2^k$ signals provided by said delay arrangement in accordance with said k most significant bits of said digital n-bit control signal;

wherein said phase modulating system further comprises a digital-to-analog converter converting the n–k least significant bits of said digital n-bit control signal into an analog control signal; and wherein said phase modulating system further comprises an analogously controlled component receiving a selected signal from said switching component, shifting said received signal in phase in accordance with an analog control signal provided by said digital-to-analog converter, and providing said shifted signal as a final phase modulated output signal.

8. The phase modulating system according to claim 7, wherein said analogously controlled component is one of an analog phase shifter and a tunable delay element.

9. A method of modulating the phase of a signal based on a digital control signal, said method comprising:

receiving said signal which is to be modulated;

delaying said received signal in sequence by x delay elements, with $x \geq 1$, each of said x delay elements applying a delay of D to a respectively received signal;

delaying said received signal in sequence by y delay elements, with $y \geq 1$, each of said y delay elements applying a delay of $D*(x+1)$ to a respectively received signal;

delaying the signal output by zero or more of said x delay elements in sequence by at least one further delay element, each of said further delay elements applying a delay of $D*(x+1)$ to a respectively received signal; and selecting one of said received signal and a delayed signal output by one of said x, y and further delay elements in accordance with said digital control signal as a phase modulated output signal, wherein said digital control signal is a digital n-bit control signal;

wherein said delaying steps delay said signal which is to be modulated to obtain $2^k$ signals of different phase angles at a signal input to said x delay elements and a respective output of the x, y and further delay elements, where k corresponds to a number of most significant bits of said n-bit control signal;

wherein said selection step comprises selecting and forwarding one of said $2^k$ signals in accordance with said k most significant bits of said digital n-bit control signal;

wherein said method further comprises converting the n–k least significant bits of said digital n-bit control signal into an analog control signal; and wherein said method further comprises shifting said selected one of said $2^k$ signals in phase in accordance with said analog control signal, and providing said shifted signal as a final phase modulated output signal.

10. A phase modulating system for modulating the phase of a signal based on a digital control signal, said phase modulating system comprising:

signal input for receiving a signal which is to be modulated;

connected to said signal input x delay elements connected to each other in series, with $x \geq 1$, each of said x delay elements applying a delay of D to a respectively received signal;

connected to said signal input y delay elements connected to each other in series, with $y \geq 1$, each of said y delay elements applying a delay of $D*(x+1)$ to a respectively received signal;

connected to an output of zero or more of said x delay elements at least one further delay element, wherein in case more than one further delay element is connected to the output of any of said x delay elements, said respective further delay elements being connected to each other in series, each of said further delay elements applying a delay of $D*(x+1)$ to a respectively received signal; and a switching component selecting the signal at one of the signal input and the output of one of the x, y and further delay elements in accordance with said digital control signal as a phase modulated output signal, wherein said digital control signal is a digital n-bit control signal;

wherein said phase modulating system further comprises a digital-to-analog converter converting the n−k least significant bits of said digital n-bit control signal into an analog control signal;

wherein said phase modulating system further comprises an analog phase shifter receiving said signal which is to be modulated and shifting said received signal in phase in accordance with an analog control signal provided by said digital-to-analog converter;

wherein said signal input, said x delay elements, said y delay elements and said further delay elements form a delay arrangement receiving a phase shifted signal from said analog phase shifter and delaying said signal to obtain at the signal input and the output of the x, y and further delay elements $2^k$ signals of different phase angles, where k corresponds to a number of most significant bits of said n-bit control signal; and wherein said switching component selects one of $2^k$ signals provided by said delay arrangement in accordance with said k most significant bits of said digital n-bit control signal as a phase modulated output signal.

11. A method of modulating the phase of a signal based on a digital control signal, said method comprising:

receiving said signal which is to be modulated;

delaying said received signal in sequence by x delay elements, with $x \geq 1$, each of said x delay elements applying a delay of D to a respectively received signal;

delaying said received signal in sequence by y delay elements, with $y \geq 1$, each of said y delay elements applying a delay of $D*(x+1)$ to a respectively received signal;

delaying the signal output by zero or more of said x delay elements in sequence by at least one further delay element each of said further delay elements applying a delay of $D*(x+1)$ to a respectively received signal; and selecting one of said received signal and a delayed signal output by one of said x, y and further delay elements in accordance with said digital control signal as a phase modulated output signal, wherein said digital control signal is a digital n-bit control signal;

wherein said method comprises a preceding step of converting the n−k least significant bits of said digital n-bit control signal into an analog control signal;

wherein said method further comprises a preceding step of shifting said signal which is to be modulated in phase in accordance with said analog control signal;

wherein said delaying steps delay said phase shifted signal to obtain $2^k$ signals of different phase angles at a signal input to said x delay elements and a respective output of the x, y and further delay elements, where k corresponds to the number of most significant bits of said n-bit control signal; and wherein said selection steps comprises selecting one of said $2^k$ signals in accordance with said k most significant bits of said digital n-bit control signal as a phase modulated output signal.

12. A phase modulating system for modulating the phase of a signal based on a digital control signal, said phase modulating system comprising:

signal input for receiving a signal which is to be modulated;

connected to said signal input x delay elements connected to each other in series, with $x \geq 1$, each of said x delay elements applying a delay of D to a respectively received signal;

connected to said signal input y delay elements connected to each other in series, with $y \geq 1$, each of said y delay elements applying a delay of $D*(x+1)$ to a respectively received signal;

connected to an output of zero or more of said x delay elements at least one further delay element, wherein in case more than one further delay element is connected to the output of any of said x delay elements, said respective further delay elements being connected to each other in series, each of said further delay elements applying a delay of $D*(x+1)$ to a respectively received signal; and a switching component selecting the signal at one of the signal input and the output of one of the x, y and further delay elements in accordance with said digital control signal as a phase modulated output signal said phase modulating system arranged for modulating the phase of signals of different frequencies down to a minimum frequency based on a respective digital control signal, wherein said signal input, said x delay elements, said y delay elements and said further delay elements form a delay arrangement delaying said signal which is to be modulated for obtaining at the signal input and the output of the x, y and further delay elements a plurality of signals which are delayed in equal steps, the number of said plurality of signals being selected such that the maximum delay is at least basically equal to one period of a signal of said minimum frequency minus the size of said equal steps of delays;

wherein said phase modulating system further comprises a scaling unit receiving a digital control signal for a signal which is to be modulated and scaling said digital control signal depending on the frequency of said signal which is to be modulated for obtaining a scaled digital control signal, the scaling factor being the smaller the higher the frequency of said signal which is to be modulated; and wherein said switching component selects one of said signals out of said plurality of signals provided by said delay arrangement according to a scaled digital control signal provided by said scaling unit as a phase modulated output signal.

13. The phase modulating system according to claim 12, wherein a scaling factor of one is applied by said scaling unit to control signals which are provided for signals having said minimum frequency.

14. A method of modulating the phase of a signal based on a digital control signal, said method comprising:

receiving said signal which is to be modulated;

delaying said received signal in sequence by x delay elements, with $x \geq 1$, each of said x delay elements applying a delay of D to a respectively received signal;

delaying said received signal in sequence by y delay elements, with $y \geq 1$, each of said y delay elements applying a delay of $D*(x+1)$ to a respectively received signal;

delaying the signal output by zero or more of said x delay elements in sequence by at least one further delay element, each of said further delay elements applying a delay of $D*(x+1)$ to a respectively received signal; and selecting one of said received signal and a delayed signal output by one of said x, y and further delay elements in accordance with said digital control signal as a phase modulated output signal, said method used for modulating the phase of signals of different frequencies down to a minimum frequency based on a respective digital control signal, wherein said delaying steps delay a signal which is to be modulated for obtaining a plurality of signals which are delayed in equal steps at a signal input to said x delay elements and a respective output of the x, y and further delay elements, the number of said plurality of signals being selected such that the maximum delay is at least basically equal to one period of a signal of said minimum frequency minus the size of said equal steps of delays;

wherein said method further comprises scaling a digital control signal provided for said signal which is to be modulated depending on the frequency of said signal which is to be modulated for obtaining a scaled digital control signal, the scaling factor being the smaller the higher the frequency of said signal which is to be modulated; and wherein said selection step comprises selecting one of said signals out of said obtained plurality of signals which are delayed in equal steps according to said scaled digital control signal as a phase modulated output signal.

* * * * *